US008072001B2

(12) United States Patent
Ohbu et al.

(10) Patent No.: US 8,072,001 B2
(45) Date of Patent: Dec. 6, 2011

(54) HETEROJUNCTION BIPOLAR TRANSISTOR AND METHOD FOR MANUFACTURING THE SAME, AND POWER AMPLIFIER USING THE SAME

(75) Inventors: Isao Ohbu, Sagamihara (JP); Chushiro Kusano, Niza (JP); Yasunari Umemoto, Sayama (JP); Atsushi Kurokawa, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/879,205

(22) Filed: Sep. 10, 2010

(65) Prior Publication Data
US 2010/0327980 A1 Dec. 30, 2010

Related U.S. Application Data

(60) Division of application No. 11/723,769, filed on Mar. 22, 2007, now Pat. No. 7,804,109, which is a continuation of application No. 11/019,270, filed on Dec. 23, 2004, now Pat. No. 7,256,434.

(30) Foreign Application Priority Data

Jan. 19, 2004 (JP) ................................. 2004-010288
Sep. 30, 2004 (JP) ................................. 2004-287312

(51) Int. Cl.
*H01L 29/73* (2006.01)

(52) U.S. Cl. .. 257/167; 257/196; 257/582; 257/E29.176
(58) Field of Classification Search ................. 257/167, 257/196, 582, E29.176
See application file for complete search history.

(56) References Cited

U.S. PATENT DOCUMENTS

| 6,507,089 B1 | 1/2003 | Azuma et al. | |
|---|---|---|---|
| 6,545,340 B1* | 4/2003 | Higgs et al. | 257/565 |
| 6,611,008 B2 | 8/2003 | Twynam et al. | |
| 6,768,140 B1 | 7/2004 | Hong et al. | |
| 7,045,877 B2* | 5/2006 | Umemoto et al. | 257/567 |
| 2002/0088993 A1 | 7/2002 | Twynam et al. | |
| 2005/0156194 A1* | 7/2005 | Ohbu et al. | 257/197 |
| 2007/0164316 A1* | 7/2007 | Ohbu et al. | 257/197 |
| 2010/0327980 A1* | 12/2010 | Ohbu et al. | 330/310 |

FOREIGN PATENT DOCUMENTS

| JP | 9-102502 A | 4/1997 |
|---|---|---|
| JP | 2000-260784 A | 9/2000 |
| JP | 2003-23012 A | 1/2003 |
| JP | 2004-6531 A | 1/2004 |
| WO | WO98/53502 | 11/1998 |

* cited by examiner

*Primary Examiner* — David Vu
*Assistant Examiner* — Earl Taylor
(74) *Attorney, Agent, or Firm* — Mattingly & Malur, PC

(57) ABSTRACT

A heterojunction bipolar transistor with InGaP as the emitter layer and capable of both reliable electrical conduction and thermal stability wherein a GaAs layer is inserted between the InGaP emitter layer and AlGaAs ballast resistance layer, to prevent holes reverse-injected from the base layer from diffusing and reaching the AlGaAs ballast resistance layer.

2 Claims, 17 Drawing Sheets

HETEROJUNCTION BIPOLAR TRANSISTOR AND METHOD FOR MANUFACTURING THE SAME, AND POWER AMPLIFIER USING THE SAME

This is a divisional application of U.S. application Ser. No. 11/723,769, filed Mar. 22, 2007, now allowed, which is a continuation application of U.S. application Ser. No. 11/019,270, filed Dec. 23, 2004, now U.S. Pat. No. 7,256,434, the contents of which are hereby incorporated by reference into this application.

CLAIM OF PRIORITY

The present application claims priority from Japanese application JP 2004-010288 filed on Jan. 19, 2004, and Japanese application JP 2004-287312 filed on Sep. 30, 2004, the contents of which are hereby incorporated by reference into this application.

FIELD OF THE INVENTION

The present invention relates to a high reliability heterojunction bipolar transistor, a manufacturing method thereof, and further relates to a power amplifier utilizing that heterojunction bipolar transistor.

BACKGROUND OF THE INVENTION

The rapidly growing demand for mobile communications equipment has spurred intensive research and development work on power amplifiers used in communications equipment. Semiconductor transistors utilized in mobile communications equipment power amplifiers include heterojunction bipolar transistors (hereafter abbreviated to HBT), field effect transistors (hereafter abbreviated to FET), and SiMOS (Metal-Oxide-Semiconductors) FET, etc. Among these semiconductor transistors, the HBT possesses features including excellent linear input/output characteristics, operation only on a positive supply voltage, not requiring a negative power generation circuit and components, and a high output power density, as well as a low cost and compact space-saving size due to a small chip surface area. The HBT is therefore a main type transistor oriented to mobile communications equipment for power amplifiers.

However, the HBT has the problem of unstable operation due to heat in a phenomenon called thermal runaway. To deal with this problem, a stabilizing resistor called a ballast resistor is used to stabilize the operation. One means stable operation via a ballast resistance utilized an AlGaAs ballast resistor layer over the InGaP emitter layer. This technology was disclosed in the re-publication of WO98/53502, Table 1 (patent document 1).

[Patent document 1] WO98/53502 (Table 1)

The technology disclosed in WO98/53502 had the problem of reliability in electrical conduction to the device. In other words, a drastic deterioration in device characteristics occurred in HBT containing an AlGaAs ballast resistor layer on top of an InGaP emitter layer. On the other hand, the problem of unstable operation due to thermal runaway as described above occurred when this type of ballast layer was not used.

SUMMARY OF THE INVENTION

In view of these problems with the related art, the present invention has a first object of providing an HBT capable of both reliable electrical conduction and thermal stability containing an InGaP layer as the emitter layer. A second object of the present invention is to provide a manufacturing method for an HBT capable of both reliable electrical conduction and thermal stability containing an InGaP layer as the emitter layer. A yet third object of the present invention is to provide a power amplifier utilizing an HBT containing an InGaP layer as the emitter layer and capable of both reliable electrical conduction and thermal stability.

The first object of the present invention is achieved by an HBT containing InGaP as the emitter layer, wherein a GaAs layer is inserted between the InGaP emitter layer and AlGaAs ballast resistance layer, to prevent holes reverse-injected from the base layer from diffusing and reaching the AlGaAs ballast resistance layer. More specifically, the object of the invention is achieved by setting the thickness of the GaAs layer inserted between the InGaP emitter layer and AlGaAs ballast resistance layer according to the actual HBT operating conditions, so that the depletion layer formed between the emitter/base does not reach the AlGaAs ballast resistance layer. In other words, the object is achieved by setting the thickness of the GaAs layer inserted between the InGaP emitter layer and AlGaAs ballast resistance layer, to a thickness greater than the width of the depletion layer formed between the emitter/base, according to the actual HBT operating conditions.

In GaAs type HBT, the present invention utilizes the preferred properties (characteristics) of InGaP as an emitter, and to also obtain ballast properties, utilizes the preferred properties of the AlGaAs ballast resistance layer. However by utilizing the GaAs layer as the buffer layer, the present invention can provide an HBT as described above that satisfies both the need for thermal stability and reliable electrical conduction as HBT properties.

The actual thickness of the GaAs layer differs according to settings for conditions such as donor concentration in the GaAs layer, and the voltage across the emitter/base when actually operating the HBT. However, the thickness is generally set in a range from about 2 to 500 nanometers when the voltage across the emitter/base is 1.2 volts or more. A donor concentration range of approximately $5 \times 10^{16}$ $cm^{-3}$ to $5 \times 10^{18}$ $cm^{-3}$ is also used. Under actual operating conditions in an HBT containing an InGaP emitter layer and a GaAs base layer, the voltage across the emitter/base is generally 1.2 volts or more. A satisfactory total thickness for the GaAs layer and the InGaP emitter layer under actual HBT operating conditions when the donor concentrations in the GaAs layer are $5 \times 10^{16}$ $cm^{-3}$, $5 \times 10^{17}$ $cm^{-3}$, $5 \times 10^{18}$ $cm^{-3}$, are respectively, 70, 27, and 20 nanometers.

The second object of the present invention is achieved by a process for sequentially forming an emitter electrode, forming an emitter mesa, forming a base electrode, forming a base mesa, and forming a collector electrode. A more specific example of that process is described next.

The method for manufacturing an HBT on a semi-insulated substrate contains at least a process for sequentially forming a lamination of a collector semiconductor layer, a base semiconductor layer, an InGaP emitter semiconductor layer, a GaAs semiconductor layer, and an AlGaAs ballast resistance semiconductor layer; a process for forming an emitter electrode in the desired shape on the upper section of the AlGaAs ballast resistance semiconductor layer; a process for forming the AlGaAs ballast resistance layer, and the GaAs semiconductor layer into a mesa shape to form the emitter region, a process for forming the InGaP emitter semiconductor layer and the base semiconductor layer into a mesa shape to form the base region, a process for forming a base electrode in the base region, a process for processing the collector semiconductor layer into a mesa shape to form a collector region, and a process for forming a collector electrode on that collector region.

The third object of the present invention is achieved by a power amplifier containing multiple stages of connected amplifier circuits comprised of at least one or more basic HBTs connected in parallel. The basic HBT includes an AlGaAs ballast resistance layer on an InGaP emitter layer, with a GaAs semiconductor layer inserted between the InGaP emitter layer and the AlGaAs ballast resistor layer, and the thickness of the GaAs layer is set thicker than the width of the depletion layer formed between the emitter/base under the actual HBT operating conditions.

The present invention is capable of providing a heterojunction bipolar transistor (HBT) capable of both reliable electrical conduction and thermal stability. Another aspect of the present invention is capable of providing a heterojunction bipolar transistor (HBT) manufacturing method capable of achieving both reliable electrical conduction and thermal stability. Still another aspect of the present invention is capable of providing a power amplifier capable of achieving both reliable electrical conduction and thermal stability.

DETAILED DESCRIPTION OF THE PREFERRED EMBODIMENTS

Figure 1:
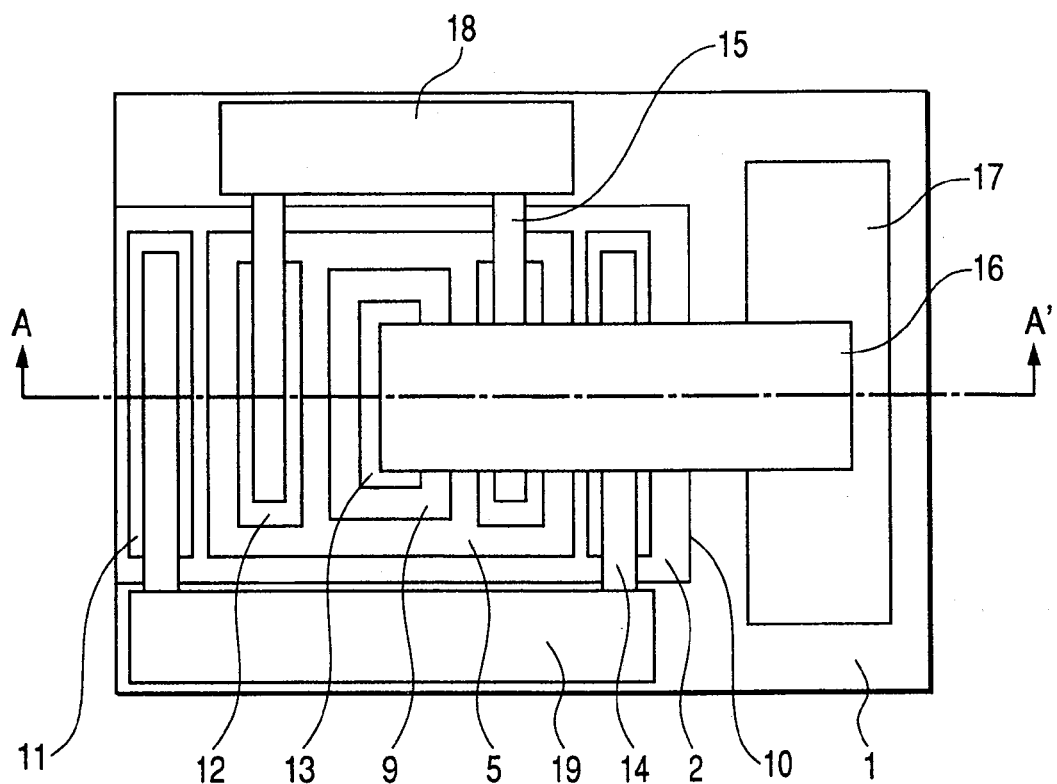
FIG. 1 is a plan view of the heterojunction bipolar transistor of the embodiment of the present invention.

The present embodiments of the heterojunction bipolar transistor, as well as the heterojunction bipolar transistor manufacturing method and a power amplifier utilizing that heterojunction bipolar transistor are described next in detail while referring to the accompanying drawings. In all drawings for describing the embodiments, the same reference numerals are assigned for sections having the same functions and redundant descriptions are omitted.

First Embodiment

Figure 2:
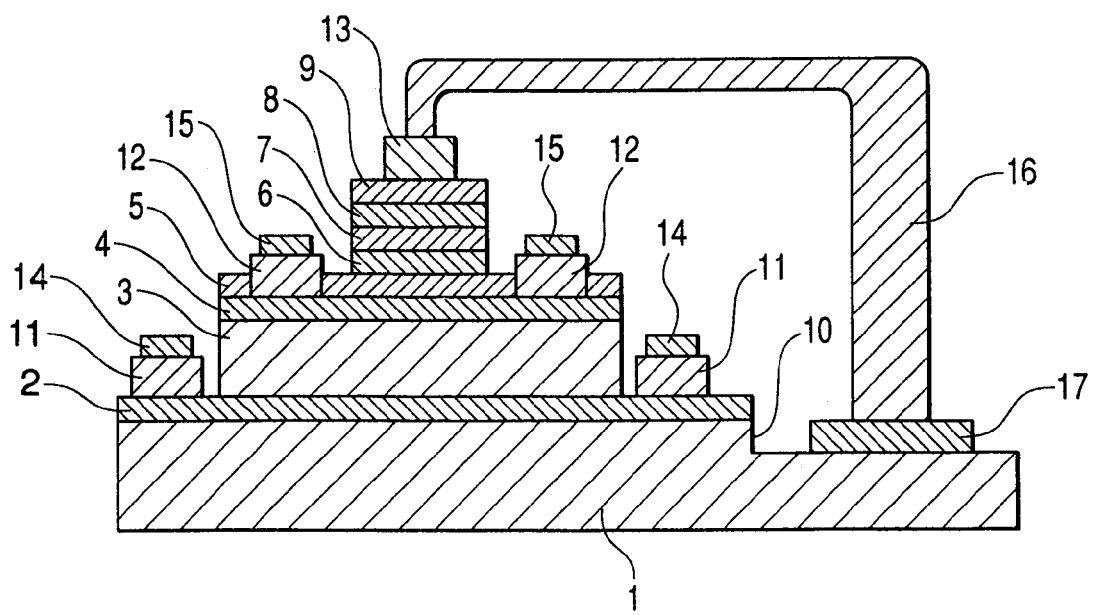
FIG. 2 is a cross sectional view of the heterojunction bipolar transistor of the embodiment of the present invention.

The HBT according to a first embodiment of the present invention is described next with reference to the accompanying drawings. The present embodiment is for describing the fundamental principle of the present invention and shows a general or concept shape of each section. FIG. 1 is a planar (or flat) view of the HBT of the present invention. A cross sectional view is shown in FIG. 2 taken along the line AA' in FIG. 1. The emitter size is 108 µm$^2$.

In the present invention, the generally used items of the related art are sufficient for other essential structural elements than the described emitter layer, GaAs layer, and the ballast resistance layer. For example, a GaAs layer may be used as the base layer and semi-insulating semiconductor substrate, and a GaAs layer as the collector layer.

An n-type GaAs sub-collector layer (Si concentration $5\times10^{18}$ cm$^{-3}$, film thickness 0.6 μm) 2 is formed on the semi-insulating GaAs substrate 1. Layers comprised of an n-type GaAs collector layer (Si concentration $1\times10^{18}$ cm$^{-3}$, film thickness 1.0 μm) 3, and a p-type GaAs base layer (C concentration $4\times10^{18}$ cm$^{-3}$, film thickness 150 nm) 4, and an n-type InGaP emitter layer (InP mol ratio 0.5, Si concentration $3\times10^{17}$ cm$^{-3}$, film thickness 30 nm) 5 are formed on this sub-collector layer 2. A base electrode 12 is formed through the emitter layer 5.

An n-type GaAs layer (Si concentration $3\times10^{17}$ cm$^{-3}$, film thickness 90 nm) 6, an n-type AlGaAs ballast resistance layer (AlAs mol ratio 0.33, Si concentration $1\times10^{17}$ cm$^{-3}$, film thickness 120 nm) 7, an n-type GaAs contact layer (Si concentration $1\times10^{18}$ cm$^{-3}$, film thickness 50 nm) 8, an n-type InGaAs contact layer (InAs mol ratio 0.5, Si concentration $1\times10^{19}$ cm$^{-3}$, film thickness 50 nm) 9 are formed on the emitter layer 5 on the other side. An emitter electrode 13 is formed on the contact layer 9. The collector electrodes 11 are formed facing both sides of the collector layer 3 on the sub-collector layer 2. The planar structure is formed so the collector region encloses the emitter region as seen in FIG. 1.

If relating specific examples of the collector electrode 11, the base electro If relating specific examples of the collector electrode 11, the base electrode 12 and the emitter electrode 13; the collector electrode 11 is formed from a layer of AuGe (film thickness 60 nm), Ni (film thickness 10 nm), and Au (film thickness 200 nm). The base electrode 12 is formed from layers of Ti (film thickness 50 nm), Pt (film thickness 50 nm), and Au (film thickness 200 nm). The emitter electrode 13 is formed from layers of WSi (Si mol ratio 0.3, film thickness 0.3 μm). The reference numerals 14, 15, 16 in FIG. 1, respectively denote the collector wiring, base wiring, and emitter wiring. The reference numerals 17, 18, 19 in the same figure denote the metallic pads for electrically connecting to the external sections of the HBT.

The AlGaAs ballast resistance layer must operate as a resistive element. Therefore, the thickness of the AlGaAs ballast resistance layer must be set to 10 nanometers or more to prevent the appearance of a quantum mechanical tunnel effect. The thickness of the AlGaAs ballast resistance layer was established to meet the need for resistive characteristics and prevent the quantum mechanical tunnel effect from appearing. A value of about 200 nanometers may be used. The n-type GaAs layer 6 functions as a spacer layer between the emitter layer 5 and the n-type AlGaAs ballast resistance layer. The example in the present embodiment described an AlGaAs ballast resistance layer with an AlAs mol ratio of 0.33; however, a mol ratio of 0 or more is acceptable.

When twenty HBT pieces as shown in the embodiment were subjected to an electrical conduction test of 300 hours under conditions of a collector current density of 40 kA/cm$^2$ and junction temperature of 210° C., the HBT were confirmed to have good electrical conduction reliability with no deterioration.

Figure 17:
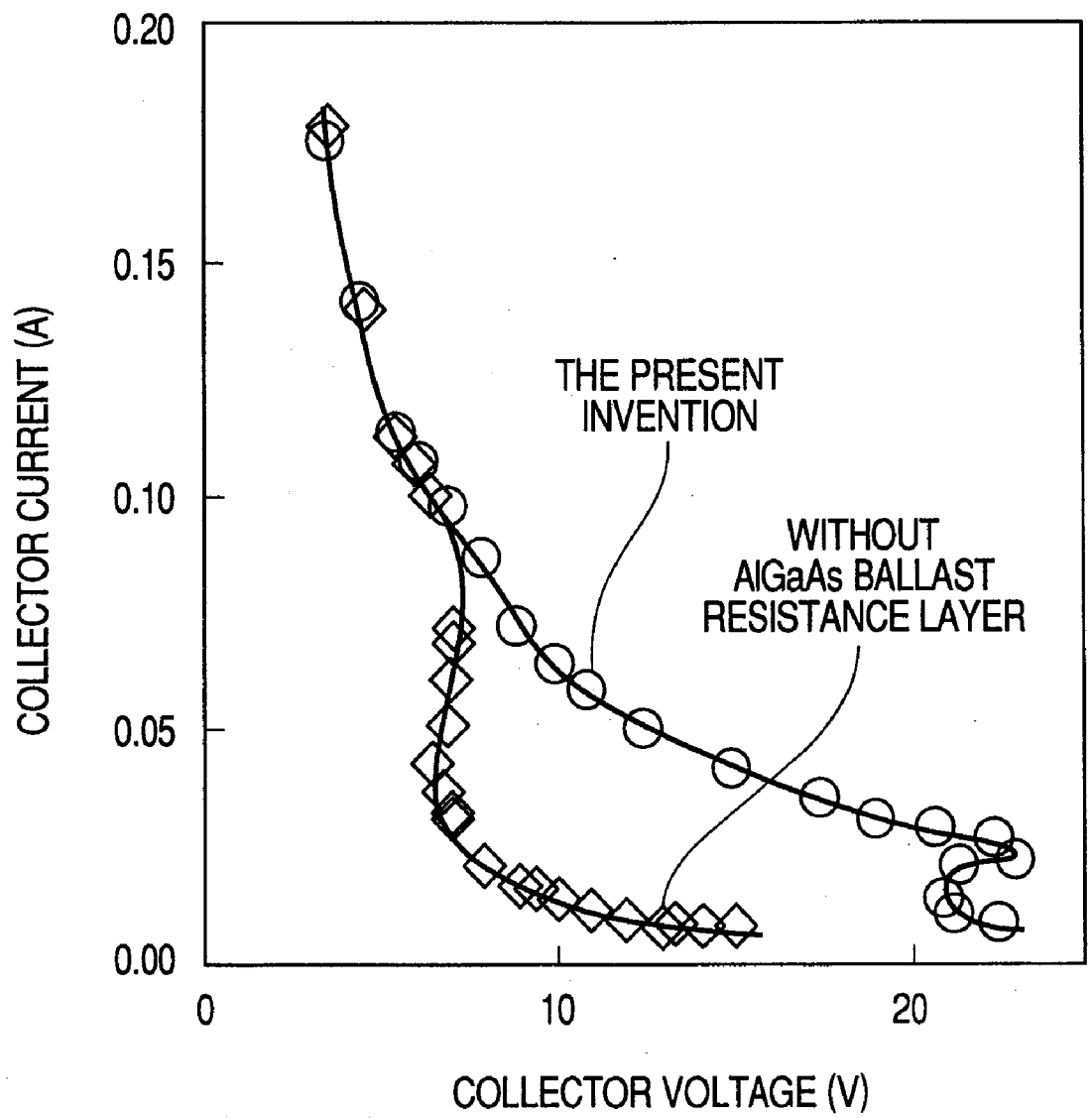
FIG. 17 is a graph showing device characteristics in the safe operating region limit of the heterojunction bipolar transistor in direct current operation.

The safe operating region limit for direct current operation which is one indicator of thermal stability in the HBT shown in the embodiment, is shown in FIG. 17. The vertical axis in FIG. 17 is the safe (non-breakdown) collector current; the horizontal axis is the safe (non-breakdown) collector voltage. Results from an HBT without the AlGaAs ballast resistance layer are also shown for purposes of comparison. These results show that the HBT with AlGaAs ballast resistance layer exhibited good breakdown resistance or in other words excellent thermal stability compared to the HBT without the AlGaAs ballast resistance layer.

The above results confirmed that the HBT of the present embodiment achieved both thermal stability and reliable electrical conduction.

Second Embodiment

Figure 3A:
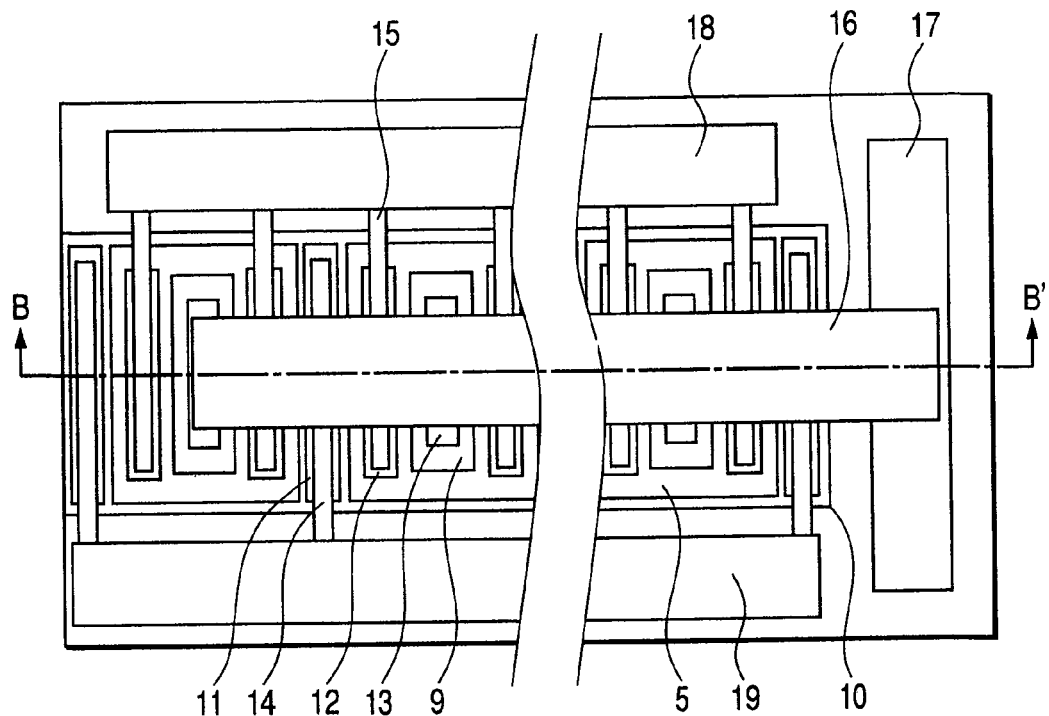
FIG. 3A is a plan view of the heterojunction bipolar transistor of the embodiment of the present invention.
Figure 3B:
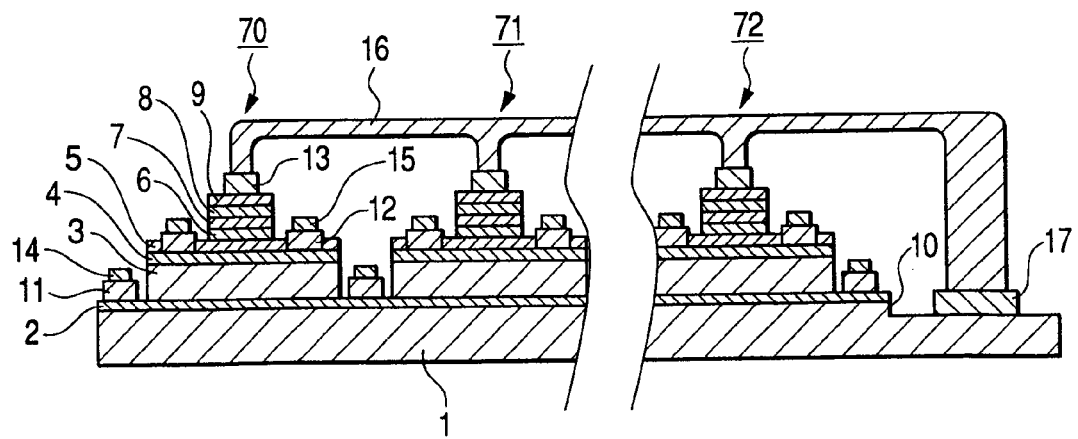
FIG. 3B is a cross sectional view of the heterojunction bipolar transistor of the embodiment of the present invention.

The second embodiment of the HBT of the present invention is described next while referring to the drawings. The present embodiment is for describing the fundamental principle of the present invention and shows a general or concept shape of each section. The planar structure of the HBT is shown in FIG. 3A. FIG. 3B shows the cross sectional structure taken along the line BB' in FIG. 3A. The present example is a large power multifinger HBT comprised of basic HBTs wired in parallel. The emitter size of the basic HBT is 108 μm$^2$.

An n-type GaAs sub-collector layer (Si concentration $5\times10^{18}$ cm$^{-3}$, film thickness 0.6 μm) 2 is formed on the semi-insulating GaAs substrate 1. Layers comprised of an n-type GaAs collector layer (Si concentration $1\times10^{18}$ cm$^{-3}$, film thickness 1.0 μm) 3, and a p-type GaAs base layer (C concentration $4\times10^{18}$ cm$^{-3}$, film thickness 150 nm) 4, and an n-type InGaP emitter layer (InP mol ratio 0.5, Si concentration $3\times10^{17}$ cm$^{-3}$, film thickness 30 nm) 5 are formed on this subcollector layer 2. A base electrode 12 is formed through the emitter layer 5.

An n-type GaAs layer (Si concentration $3\times10^{17}$ cm$^{-3}$, film thickness 90 nm) 6, an n-type AlGaAs ballast resistance layer (AlAs mol ratio 0.33, Si concentration $1\times10^{17}$ cm$^{-3}$, film thickness 120 nm) 7, an n-type GaAs contact layer (Si concentration $1\times10^{19}$ cm$^{-3}$, film thickness 50 nm) 8, an n-type InGaAs contact layer (Si concentration $1\times10^{19}$ cm$^{-3}$, film thickness 50 nm) 9 are formed on the emitter layer 5. An emitter electrode 13 is formed on the contact layer 9. The collector electrodes 11 are formed facing both sides of the collector layer 3 on the subcollector layer 2.

If relating specific examples of the collector electrode 11, the base electrode 12 and the emitter electrode 13; the collector electrode 11 is formed from a layer of AuGe (film thickness 60 nm), Ni (film thickness 10 nm), and Au (film thickness 200 nm). The base electrode 12 is formed from layers of Ti (film thickness 50 nm), Pt (film thickness 50 nm), and Au (film thickness 200 nm). The emitter electrode 13 is formed from layers of WSi (Si mol ratio 0.3, film thickness 0.3 μm). The reference numerals 14, 15, 16 in FIG. 3B, respectively denote the collector wiring, base wiring, and emitter wiring. The reference numerals 17, 18, 19 in the same figure denote the metallic pads for electrically connecting to the external sections of the HBT.

The present example is for a large power multifinger HBT so the basic HBT 70, 71 and 72 are utilized in the example. The basic HBT 70, 71 and 72 are connected in parallel. The emitter electrodes 13 are wired together. The metallic pads 17 are connected for making electrical connections with external sections of the HBT. The basic HBT itself is the same as the HBT shown in the first embodiment.

The AlGaAs resistance layer must operate as a resistive element. The thickness of the AlGaAs resistance layer must therefore be set to 10 nanometers or more to prevent the appearance of the quantum mechanical tunnel effect. The example in the present embodiment described an AlGaAs ballast resistance layer with an AlAs mol ratio of 0.33 however a mol ratio of 0 or more is acceptable.

Third Embodiment

The typical method for manufacturing the HBT of the present invention is described next while referring to the drawings. The present embodiment is for describing the fundamental principle of the present invention and shows a general or concept shape of each section. Cross sectional views of the device shown from FIG. 4A to FIG. 6C are described while referring to the processes in the method for manufacturing the HBT of the present invention. The present example is a large power multifinger HBT comprised of the basic HBT wired in parallel.

Figure 4A:
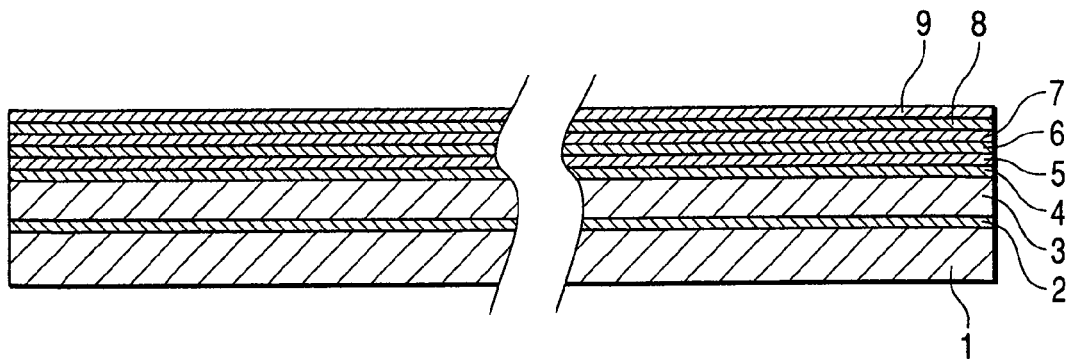
FIG. 4A is a cross sectional view of the process sequence in the method for manufacturing the bipolar transistor of the embodiment of the present invention.

An n-type GaAs subcollector layer (Si concentration $5\times10^{18}$ cm$^{-3}$, film thickness 0.6 μm) 2, an n-type GaAs collector layer (Si concentration $1\times10^{16}$ cm$^{-3}$, film thickness 1.0 μm) 3, a p-type GaAs base layer (C concentration $4\times10^{19}$ cm$^{-3}$, film thickness 150 nm) 4, an n-type InGaP emitter layer (InP mol ratio 0.5, Si concentration $3\times10^{17}$ cm$^{-3}$, film thickness 30 nm) 5, an n-type GaAs layer (Si concentration $3\times10^{17}$ cm$^{-3}$, film thickness 90 nm) 6, an n-type AlGaAs ballast resistance layer (AlAs mol ratio 0.33, Si concentration $1\times10^{17}$ cm$^{-3}$, film thickness 120 nm) 7, an n-type GaAs contact layer (Si concentration $1\times10^{19}$ cm$^{-3}$, film thickness 50 nm) 8, an n-type InGaAs contact layer (InAs mol ratio 0.5, Si concentration $1\times10^{19}$ cm$^{-3}$, film thickness 50 nm) 9 are formed on the semi-insulating GaAs substrate 1 by the metal-organic vapor phase epitaxy method (MOVPE or MOCVD) (FIG. 4A).

Figure 4B:
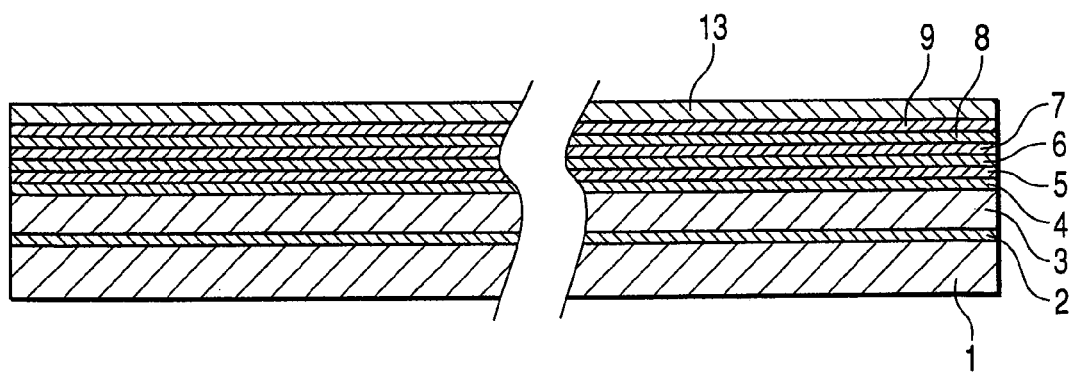
FIG. 4B is a cross sectional view of the process sequence in the method for manufacturing the bipolar transistor of the embodiment of the present invention.
Figure 4C:
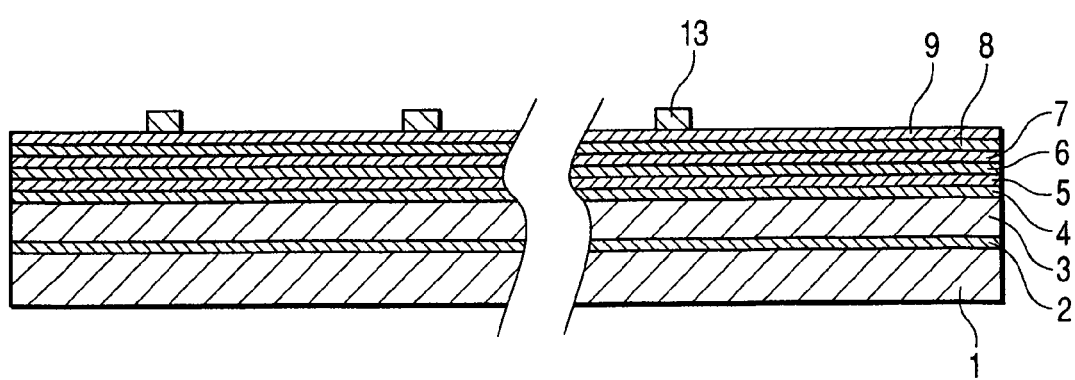
FIG. 4C is a cross sectional view of the process sequence in the method for manufacturing the bipolar transistor of the embodiment of the present invention.

Afterwards, the WSi (Si mol ratio 0.3, film thickness 0.3 μm) 13 is then deposited across the entire wafer surface using RF sputtering method (FIG. 4B). An emitter electrode 13 is formed by dry etching the WSi layer 13 using the photolithography and CF$_4$ (FIG. 4C).

Figure 5A:
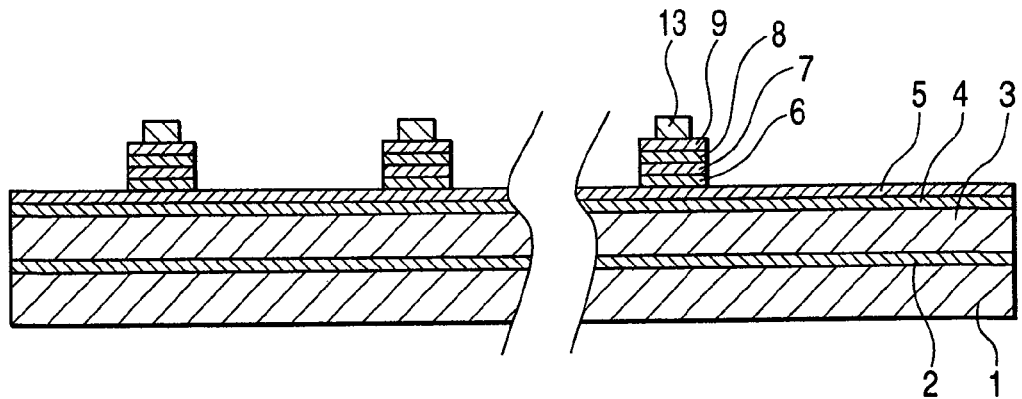
FIG. 5A is a cross sectional view of the process sequence continuing from FIG. 4C in the method for manufacturing the bipolar transistor of the embodiment of the present invention.

The n-type InGaAs contact layer 9, the n-type GaAs contact layer 8, the n-type AlGaAs ballast resistance layer 7, and the n-type GaAs layer 6 are processed into the desired shape to form the emitter region (FIG. 5A). The processing method may for example consist of the following. Unnecessary regions on the n-type InGaAs contact layer 9, the n-type GaAs contact layer 8, the n-type AlGaAs ballast resistance layer 7, and the n-type GaAs layer 6 are removed by wet etching using etching fluid (etching fluid for example in proportions of phosphoric acid to hydrogen peroxide to water of 1:2:40) and photolithography.

Figure 5B:
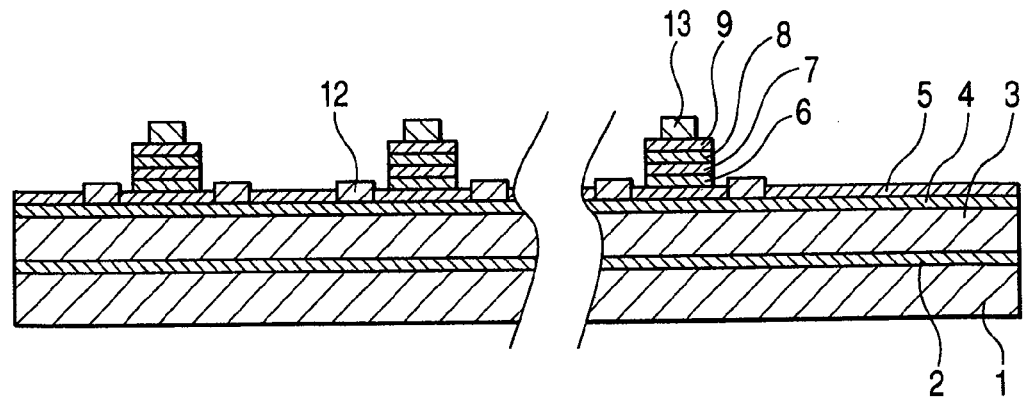
FIG. 5B is a cross sectional view of the process sequence in the method for manufacturing the bipolar transistor of the embodiment of the present invention.

Afterwards, a base electrode 12 of Ti (film thickness 50 nm), Pt (film thickness 50 nm), Au (film thickness 200 nm) is formed by the usual liftoff methods, on the base layer 4 piercing the emitter layer 5 (FIG. 5B).

Figure 5C:
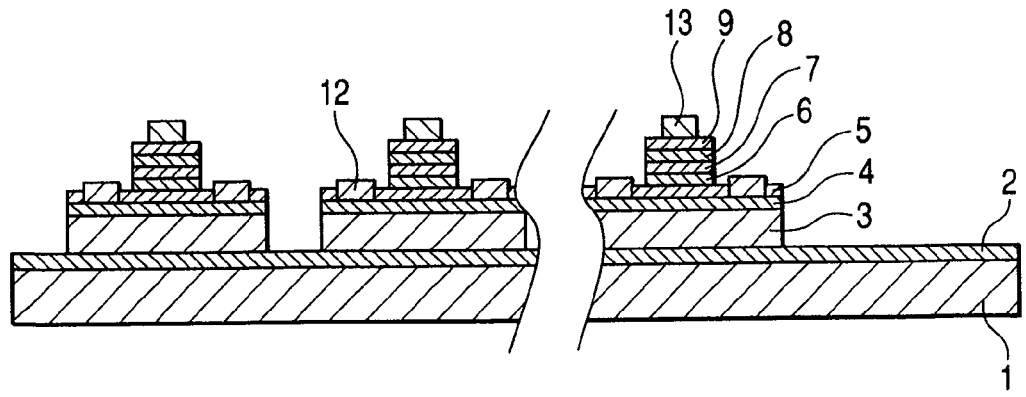
FIG. 5C is a cross sectional view of the process sequence in the method for manufacturing the bipolar transistor of the embodiment of the present invention.

The desired regions are then formed on the n-type InGaP emitter layer 5, the p-type GaAs base layer 4, and the n-type GaAs collector layer 3, by wet etching and photolithography to expose the n-type GaAs subcollector layer 2 and forming the base region (FIG. 5C). The etching fluid is comprised as follows. If etching the n-type InGaP emitter layer 5, then use hydrochloric acid as the etching fluid. If etching the p-type GaAs base layer 4 and the n-type GaAs collector layer 3 use etching fluid in proportions of phosphoric acid to hydrogen peroxide to water of 1:2:40 as given in the example.

Figure 6A:
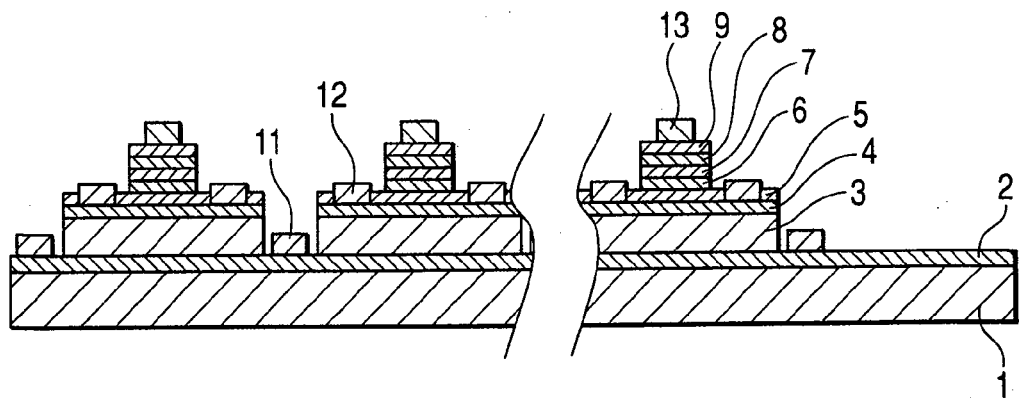
FIG. 6A is a cross sectional view of the process sequence continuing from the process in FIG. 5C in the method for manufacturing the bipolar transistor of the embodiment of the present invention.

The collector electrode 11 is then formed by the usual liftoff method and alloyed for 30 minutes at 350° C. (FIG. 6A). The collector electrode 11 structure is formed as a laminated structure of AuGe (film thickness 60 nm), Ni (film thickness 10 nm) and Au (film thickness 200 nm).

Figure 6B:
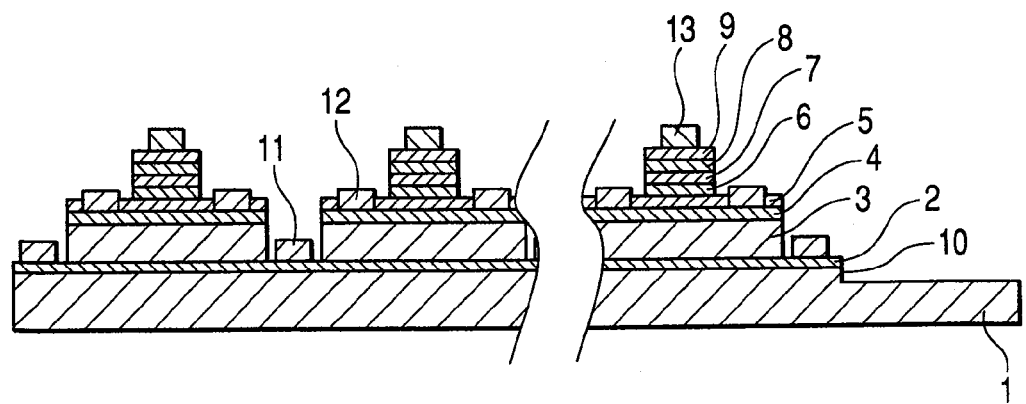
FIG. 6B is a cross sectional view of the process sequence in the method for manufacturing the bipolar transistor of the embodiment of the present invention.
Figure 6C:
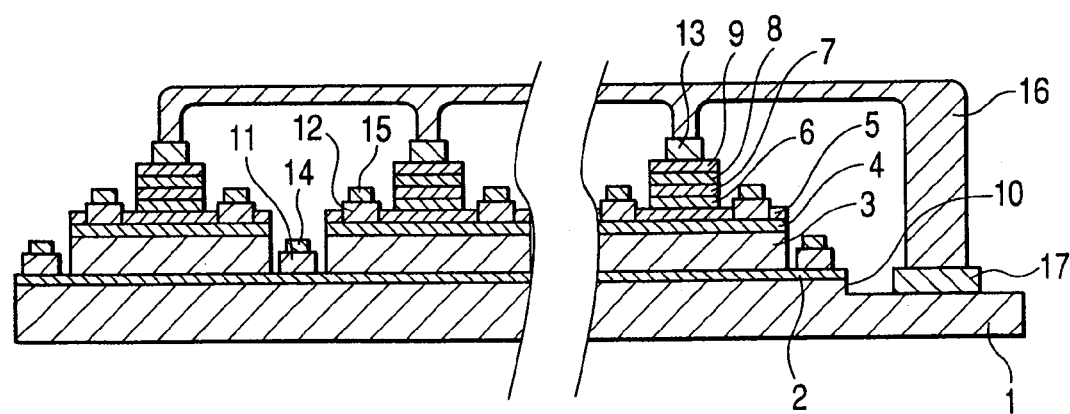
FIG. 6C is a cross sectional view of the process sequence in the method for manufacturing the bipolar transistor of the embodiment of the present invention.

Finally, an isolation groove 10 is formed (FIG. 6B). Wiring is further formed to connect the emitter electrodes, connect the base electrodes, and connect the collector electrodes on the basic HBT (FIG. 6C). The HBT is now complete.

Figure 20A:
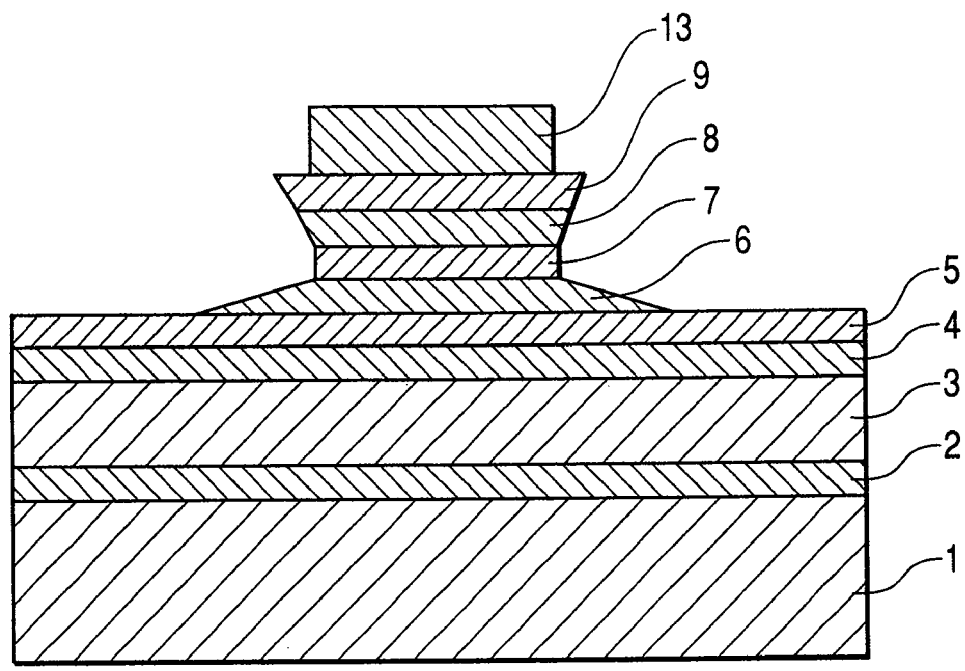
FIG. 20A is a cross sectional view of the device of the manufacturing method of the bipolar transistor of the embodiment of the present invention.
Figure 20B:
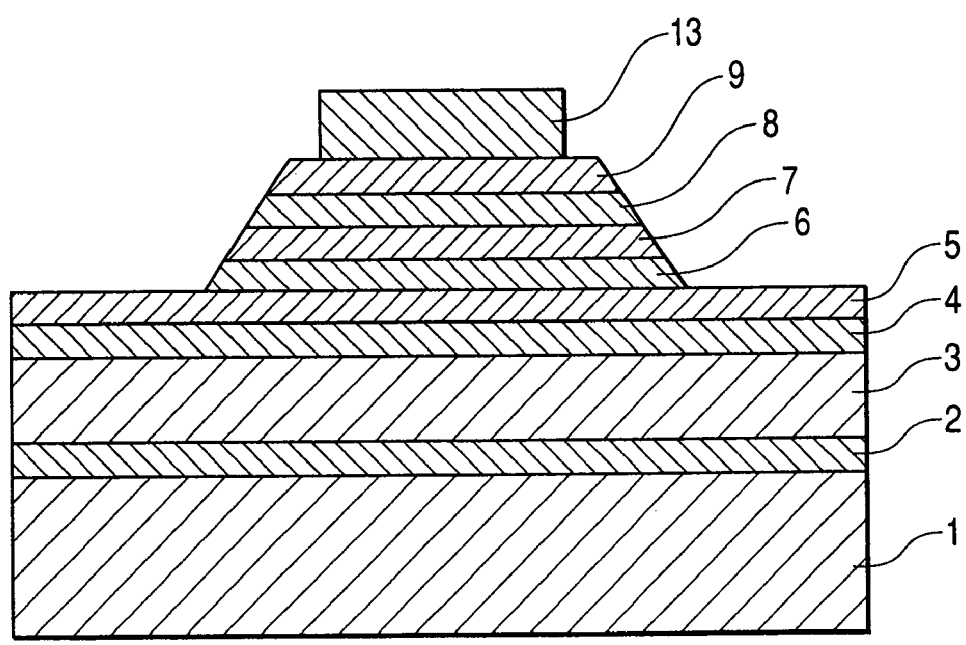
FIG. 20B is a cross sectional view of the device of the manufacturing method of the bipolar transistor of the embodiment of the present invention.

The process that determines the emitter size is the stripping process in FIG. 5A that etches the n-type InGaAs contact layer 9, the n-type GaAs contact layer 8, the n-type AlGaAs ballast resistance layer 7, and the n-type GaAs layer 6 by photolithography and wet etching. The present embodiment, the wet etching fluid was described as being comprised proportions of phosphoric acid to hydrogen peroxide to water of 1:2:40. However other etching fluid such as phosphoric acid, hydrogen peroxide and ethylene glycol in proportions of 25:6:50; or hydrofluoric acid, hydrogen peroxide, and water in proportions of 1:2:4 may be used. In such cases, the etched shape will vary according to the etching fluid, so the photomask measurement and the wet etching time must be adjusted to fabricate the emitter size to match the intended design. The detailed cross sectional shape of the crystalline surface (00-1) is shown in FIG. 20A and FIG. 20B. The example in FIG. 20A is the case where a wet etching fluid of phosphoric acid, hydrogen peroxide, and water in proportions of 1:2:40 was utilized. A constriction in the mesa shape can be seen here. In FIG. 20B however, a wet etching fluid of phosphoric acid, hydrogen peroxide, and ethylene glycol in proportions of 25:6:50 or an etching fluid of hydrofluoric acid, hydrogen peroxide, and water in proportions of 1:2:4 was used. The structure in this example (FIG. 20B) is not prone to receive effects from stress because there is no constriction in the mesa shape. The reliability has therefore been improved compared to the HBT shown in FIG. 20A.

The manufacturing method in the present example is therefore capable of fabricating an HBT that achieves both thermal stability and reliable electrical conduction.

Fourth Embodiment

Figure 7:
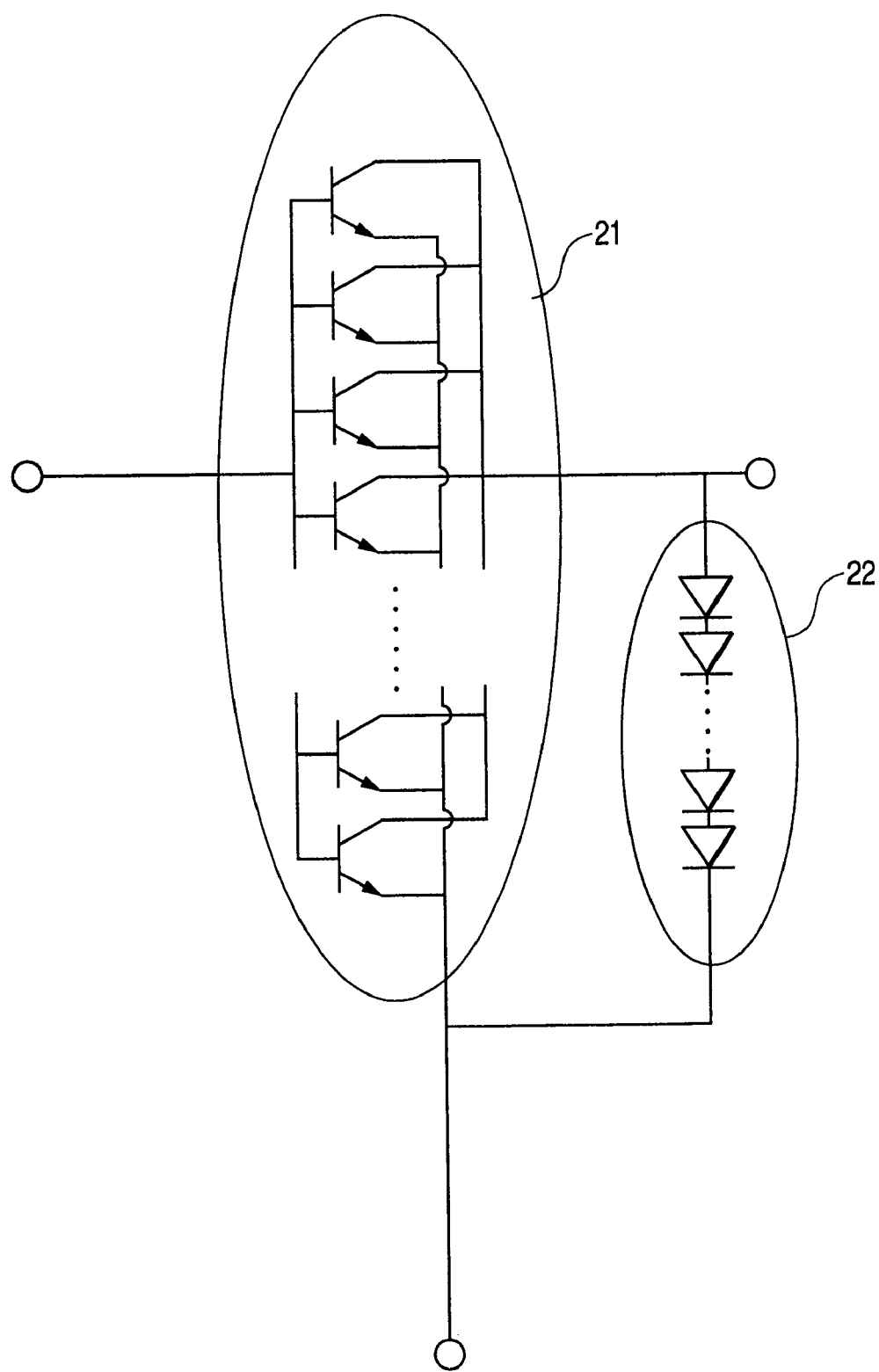
FIG. 7 is a circuit diagram of the heterojunction bipolar transistor of the embodiment of the present invention.

An equivalent circuit diagram of the HBT of the present invention is shown in FIG. 7. In this example, a static-electricity protection circuit 22 is connected in parallel with HBT21 comprised of multiple basic HBT connected in parallel. The present embodiment is for describing the fundamental principle of the present invention and shows a general or concept shape of each section.

The basic HBT that make up the HBT21 may be used to comprise the multiple individual HBT in the above described embodiment. In other words, the single HBT comprised of an n-type GaAs subcollector layer (Si concentration $5\times10^{18}$ cm$^{-3}$, film thickness 0.6 μm), an n-type GaAs collector layer (Si concentration $1\times10^{16}$ cm$^{-3}$, film thickness 1.0 μm), a p-type GaAs base layer (C concentration $4\times10^{19}$ cm$^{-3}$, film thickness 150 nm), an n-type InGaP emitter layer (InP mol ratio 0.5, Si concentration $3\times10^{17}$ cm$^{-3}$, film thickness 30 nm), an n-type GaAs layer (Si concentration $3\times10^{17}$ cm$^{-3}$, film thickness 90 nm), an n-type AlGaAs ballast resistance layer (AlAs mol ratio 0.33, Si concentration $1\times10^{17}$ cm$^{-3}$, film thickness 120 nm), an n-type GaAs contact layer (Si concentration $1\times10^{19}$ cm$^{-3}$, film thickness 50 nm), and an n-type InGaAs contact layer (InAs mol ratio 0.5, Si concentration $1\times10^{19}$ cm$^{-3}$, film thickness 50 nm) are formed on at least the semi-insulating GaAs substrate. In the example of the HBT21 shown in FIG. 7, the bases, emitters and collectors are connected in parallel to each other.

The circuit indicated by the reference numeral 22 is a protective circuit for protecting the HBT21 from damage when an excessive voltage such as a static charge is applied to the HBT21. The protective circuit 22 is comprised of multiple diodes connected in series, and these diodes are also connected in parallel with the emitter and collector of the HBT21. The protective circuit 22 is formed on a semi-insulating GaAs substrate identical to that of the HBT21.

Figure 8A:
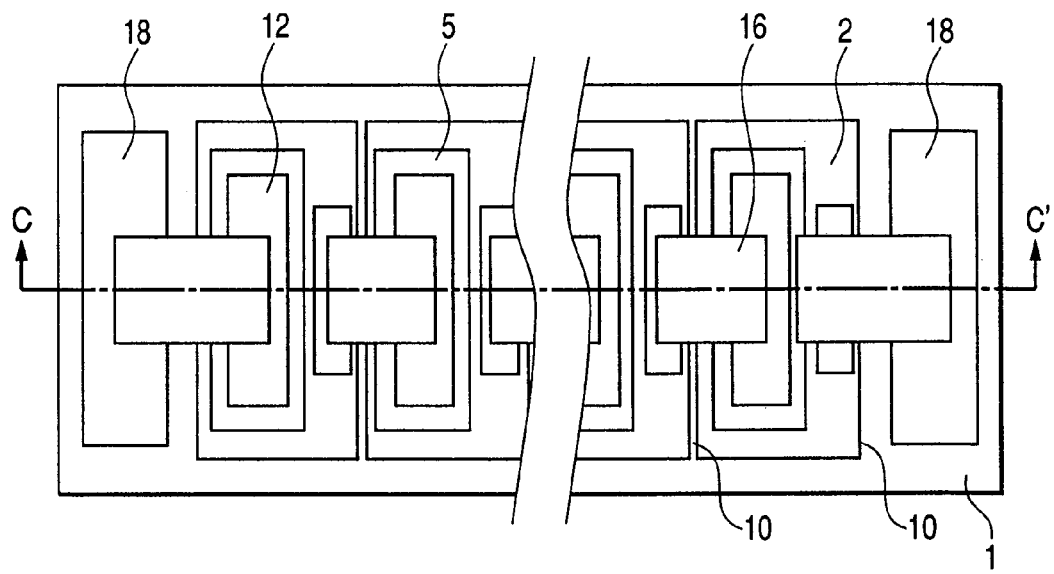
FIG. 8A is a plan view of the protective circuit device utilized in the heterojunction bipolar transistor of the embodiment of the present invention.
Figure 8B:
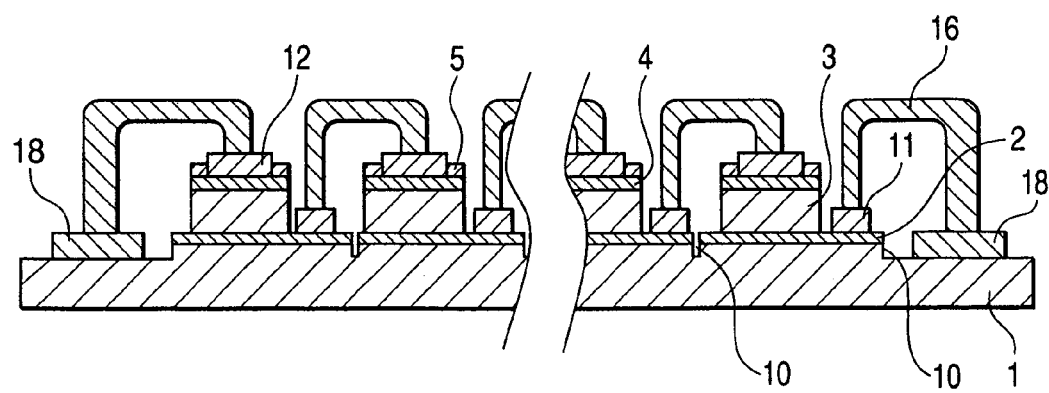
FIG. 8B is a cross sectional view of the protective circuit device utilized in the heterojunction bipolar transistor of the embodiment of the present invention.

The planar structure of the protective circuit 22 is shown in FIG. 8A. A cross section of the structure taken along lines CC' of FIG. 8A is shown in FIG. 8B. In the present embodiment, a pn junction is utilized as a diode between the base and collector of the HBT21. Here, the reference numerals 1, 2, 3, 4, and 5 respectively indicate the semi-insulating GaAs substrate, the n-type GaAs subcollector layer (Si concentration $5 \times 10^{18}$ cm$^{-3}$, film thickness 0.6 µm), the n-type GaAs collector layer (Si concentration $1 \times 10^{18}$ cm$^{-3}$, film thickness 1.0 µm), the p-type GaAs base layer (C concentration $4 \times 10^{19}$ cm$^{-3}$, film thickness 150 nm), and an n-type InGaP emitter layer (InP mol ratio 0.5, Si concentration $3 \times 10^{17}$ cm$^{-3}$, film thickness 30 nm). Also, the reference numbers 11, 12, 16, 18 respectively indicate the collector electrode made up of a layer of AuGe (film thickness 60 nm), Ni (film thickness 10 nm), and Au (film thickness 200 nm); a base electrode made up of layers of Ti (film thickness 50 nm), Pt (film thickness 50 nm), and Au (film thickness 200 nm); the wiring connecting to each diode; and the metallic pads for electrically connecting to the HBT21. The reference numeral 10 indicates an isolation groove for electrically isolating each diode. In the example in the present embodiment, the HBT21 and the protective circuit are connected by bonding wire however these components may be directly connected via the wiring 16.

In the present embodiment, the diodes comprising the protective circuit 22 switch electrically to the on state at the stage where approximately 1.2 volts are applied. Therefore, when for example utilizing a protective circuit 22 with ten diode stages connected in series, and twelve volts is applied across the collector/emitter of the HBT21, the protective circuit 22 switches to the on state to prevent the HBT21 from damage.

Figure 9A:
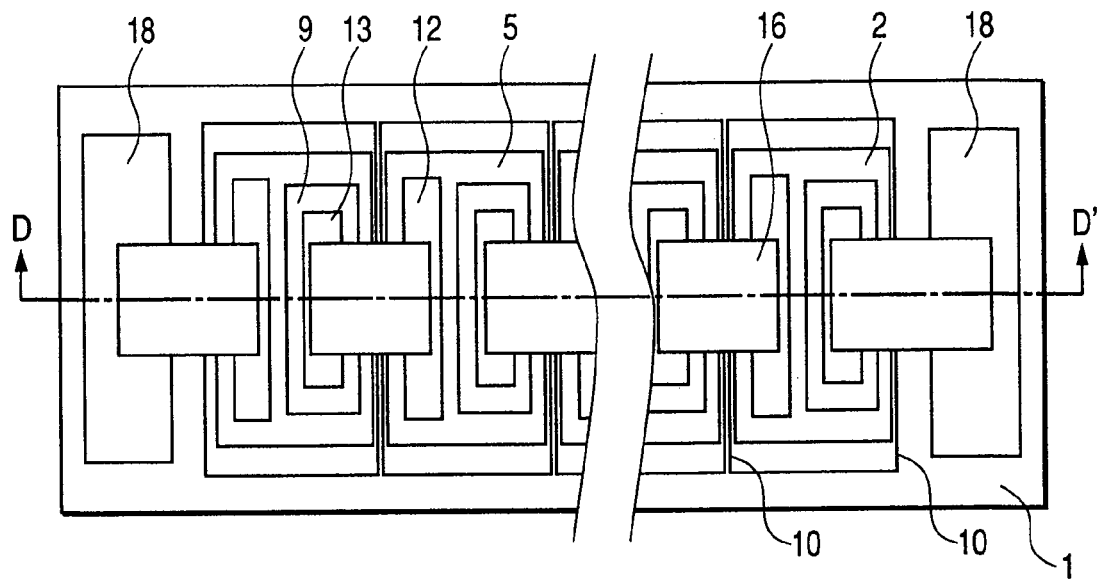
FIG. 9A is a plan view of the protective circuit device utilized in the heterojunction bipolar transistor of the embodiment of the present invention.
Figure 9B:
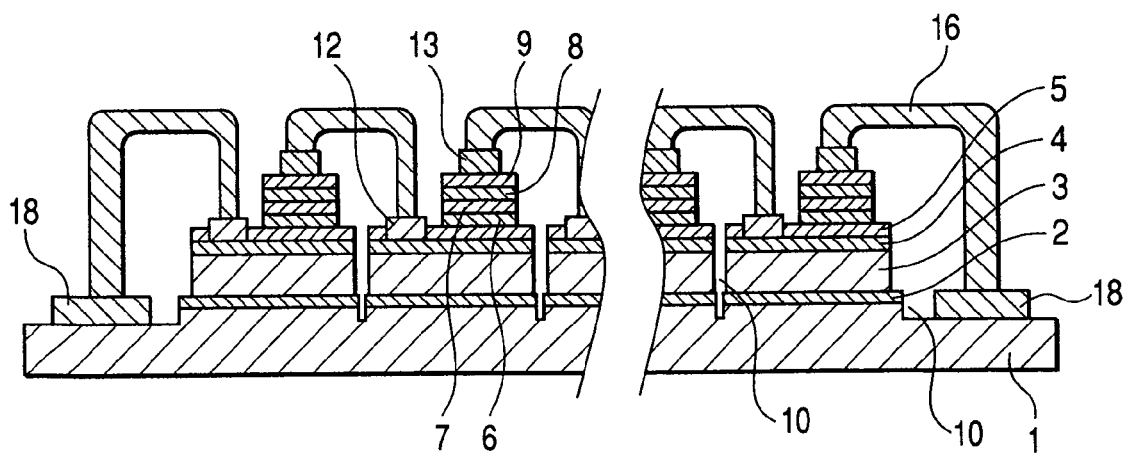
FIG. 9B is a cross sectional view of the protective circuit device utilized in the heterojunction bipolar transistor of the embodiment of the present invention.

In the embodiment, the diodes comprising the protective circuit 22 were described as utilizing a pn junction across the base/collector of the HBT21. However, diodes utilizing a pn junction across the base/emitter may also be used. FIG. 9A shows a planar (flat) structure of the protective circuit 22 in that case. FIG. 9B shows a cross section structure taken along DD' of FIG. 9A. The reference numerals, 1, 2, 3, 4, 5, 6, 7, 8, and 9 here respectively indicate the semi-insulating GaAs substrate, the n-type GaAs subcollector layer (Si concentration $5 \times 10^{18}$ cm$^{-3}$, film thickness 0.6 µm), the n-type GaAs collector layer (Si concentration $1 \times 10^{18}$ cm$^{-3}$, film thickness 1.0 µm), the p-type GaAs base layer (C concentration $4 \times 10^{19}$ cm$^{-3}$, film thickness 150 nm), the n-type InGaP emitter layer (InP mol ratio 0.5, Si concentration $3 \times 10^{17}$ cm$^{-3}$, film thickness 30 nm), the n-type GaAs layer (Si concentration $3 \times 10^{17}$ cm$^{-3}$, film thickness 90 nm), the n-type AlGaAs ballast resistance layer (AlAs mol ratio 0.33, Si concentration $1 \times 10^{17}$ cm$^{-3}$, film thickness 120 nm), the n-type GaAs contact layer (Si concentration $1 \times 10^{18}$ cm$^{-3}$, film thickness 50 nm), and an n-type InGaAs contact layer (InAs mol ratio 0.5, Si concentration $1 \times 10^{18}$ cm$^{-3}$, film thickness 50 nm). The reference numerals 12, 13, 16, and 18 respectively indicate a base electrode formed from layers of Ti (film thickness 50 nm), Pt (film thickness 50 nm), and Au (film thickness 200 nm), an emitter electrode formed from layers of WSi (Si mol ratio 0.3, film thickness 0.3 µm), the wiring connected serially with each diode, and the metallic pads for electrically connecting to the HBT. The reference numeral 10 indicates an isolation groove for electrically isolating each diode. In the example in the present embodiment, the HBT21 and the protective circuit 22 are connected by bonding wire however these components may be directly connected via the wiring 16.

In the present embodiment, the diodes comprising the protective circuit 22 switch electrically to the on state at the stage where approximately 1.2 volts are applied. Therefore, when for example utilizing a protective circuit 22 with ten diode stages connected in series, and twelve volts is applied across the collector/emitter of the HBT21, the protective circuit 22 switches to the on state to prevent the HBT21 from damage.

Figure 10A:
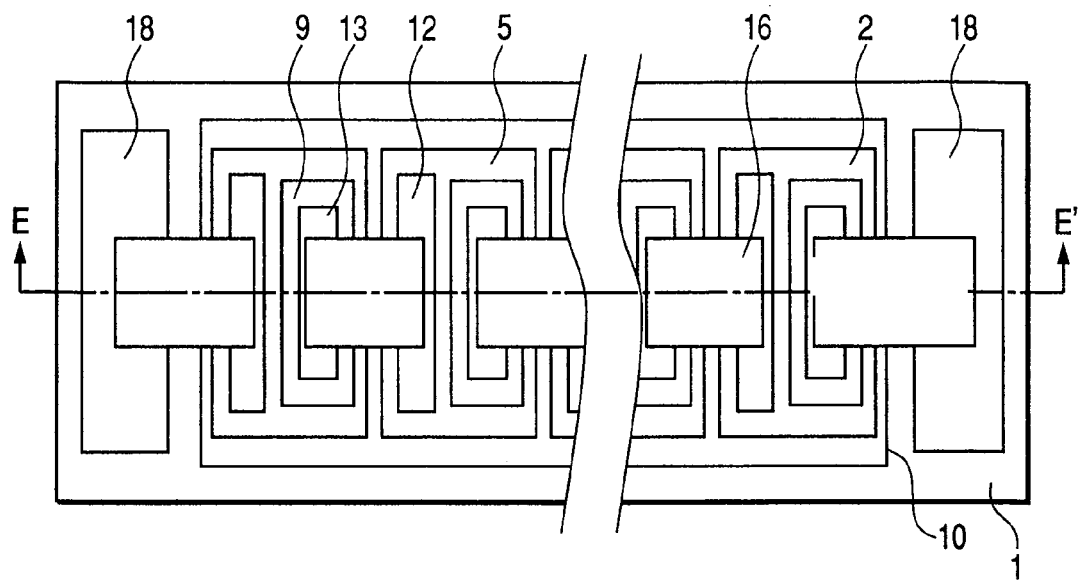
FIG. 10A is a plan view of the protective circuit device utilized in the heterojunction bipolar transistor of the embodiment of the present invention.
Figure 10B:
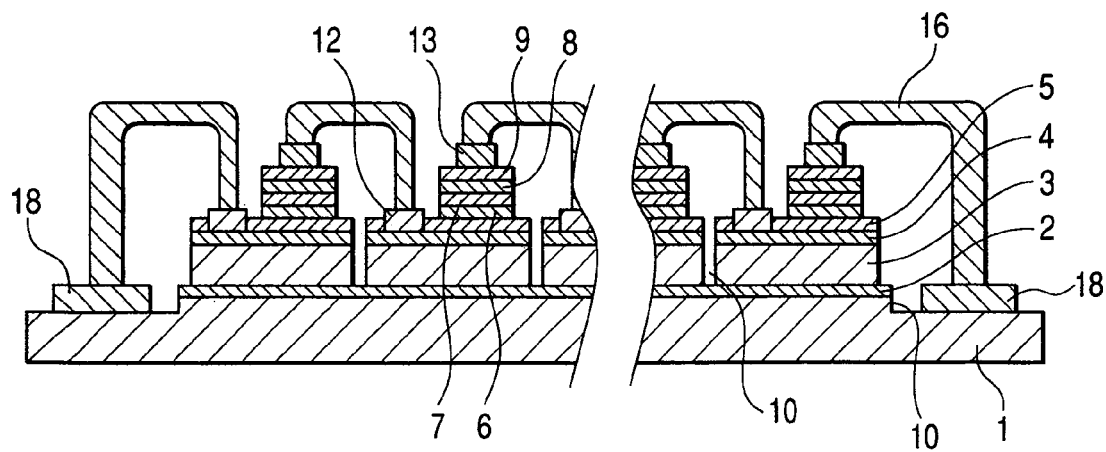
FIG. 10B is a cross sectional view of the protective circuit device utilized in the heterojunction bipolar transistor of the embodiment of the present invention.

A plan view of another embodiment of the protective circuit 22 is shown in FIG. 10A. A cross section of the structure taken along lines EE' of FIG. 10A is shown in FIG. 10B. The reference numerals, 1, 2, 3, 4, 5, 6, 7, 8, and 9 here respectively indicate the semi-insulating GaAs substrate, the n-type GaAs subcollector layer (Si concentration $5 \times 10^{18}$ cm$^{-3}$, film thickness 0.6 µm), the n-type GaAs collector layer (Si concentration $1 \times 10^{18}$ cm$^{-3}$, film thickness 1.0 µm), the p-type GaAs base layer (C concentration $4 \times 10^{19}$ cm$^{-3}$, film thickness 150 nm), the n-type InGaP emitter layer (InP mol ratio 0.5, Si concentration $3 \times 10^{17}$ cm$^{-3}$, film thickness 30 nm), the n-type GaAs layer (Si concentration $3 \times 10^{17}$ cm$^{-3}$, film thickness 90 nm), the n-type AlGaAs ballast resistance layer (AlAs mol ratio 0.33, Si concentration $1 \times 10^{17}$ cm$^{-3}$, film thickness 120 nm), the n-type GaAs contact layer (Si concentration $1 \times 10^{19}$ cm$^{-3}$, film thickness 50 nm), and an n-type InGaAs contact layer (InAs mol ratio 0.5, Si concentration $1 \times 10^{19}$ cm$^{-3}$, film thickness 50 nm). The reference numerals 12, 13, 16, and 18 respectively indicate a base electrode formed from layers of Ti (film thickness 50 nm), Pt (film thickness 50 nm), and Au (film thickness 200 nm), an emitter electrode formed from layers of WSi (Si mol ratio 0.3, film thickness 0.3 µm), the wiring connected serially with each diode, and the metallic pads for electrically connecting to the HBT. In the example in the present embodiment, the HBT21 and the protective circuit 22 are connected by bonding wire; however, these components may directly be connected via the wiring 16.

Fifth Embodiment

Figure 11:
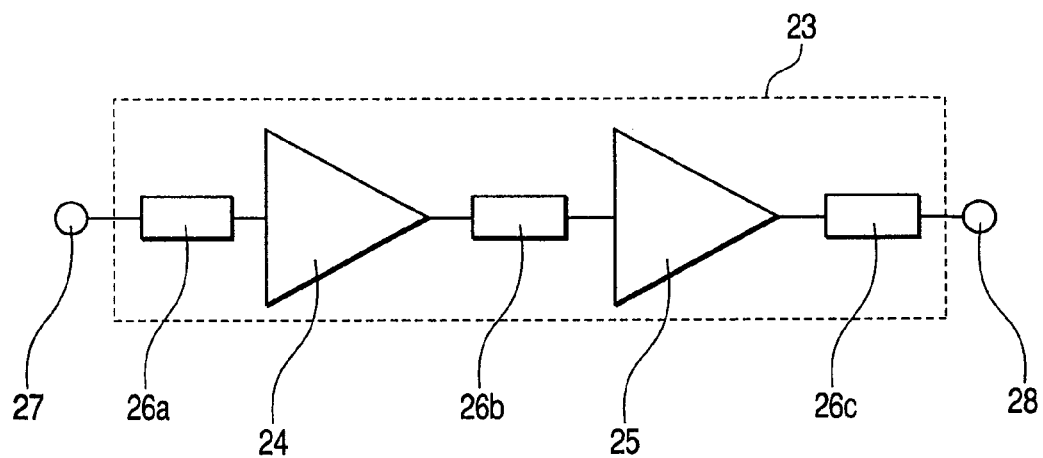
FIG. 11 is a block diagram of the power amplifier of the embodiment of the present invention.

The power amplifier constituting the fifth embodiment of the present invention is described next while referring to the accompanying drawings. The present embodiment is for describing the fundamental principle of the present invention and shows a general or concept shape of each section. FIG. 11 is a block diagram of the power amplifier of the present embodiment. The present embodiment is a power amplifier with a two-stage structure. The reference numerals 24, 25 in the figure, are respectively the first amplifier circuit and the second amplifier circuit. The reference numerals 26a, 26b, 26c are respectively the input matching circuit, the inter-stage matching circuit, and the output matching circuit. The amplified RF signal is input to the power amplifier from the terminal 27. After passing through the (impedance) matching circuits 26a, 26b, 26c and being amplified in the amplifier circuits 24, 25, the signal is output from the terminal 28.

Figure 12:
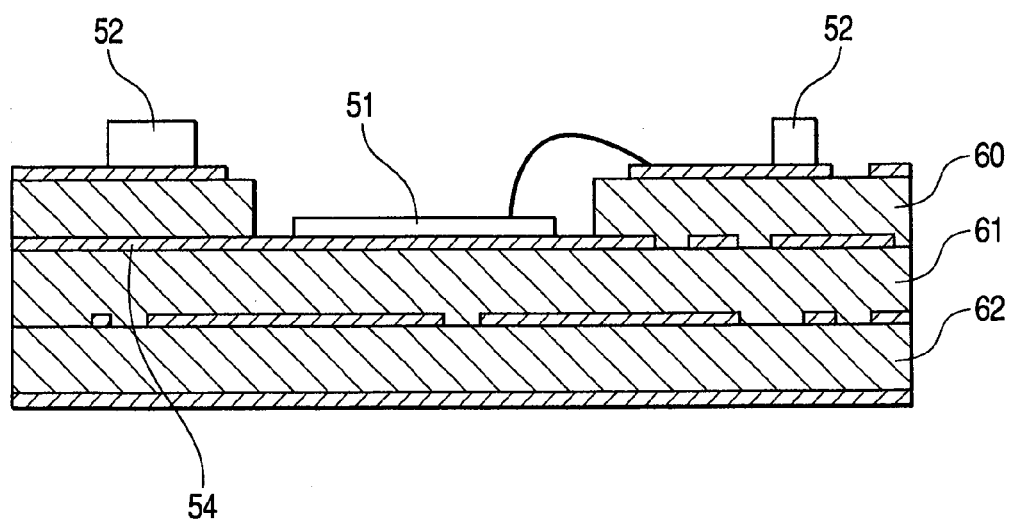
FIG. 12 is a cross sectional view of a typical power amplifier module.
Figure 13:
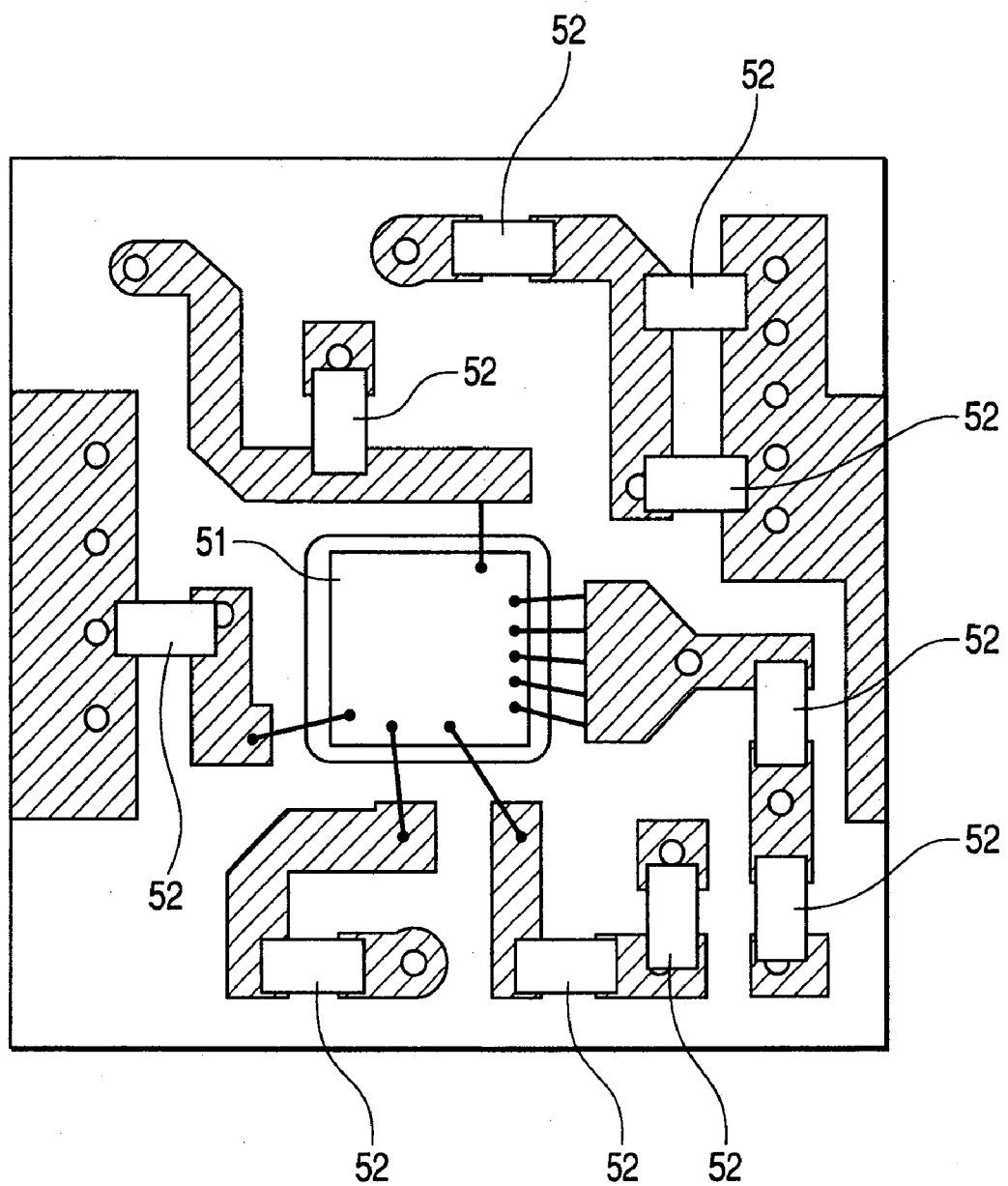
FIG. 13 is a plan view of a typical power amplifier module.

FIG. 12 and FIG. 13 are respectively a cross sectional drawing and planar (plan view) drawing showing the mounted state of a typical power amplifier module. A semiconductor device 51, and a passive element 52 are mounted on the substrate 60. The reference numeral 54 indicates a conductive layer for connecting electrical signals to the semiconductor device 51. In this example, the multiple substrates 60, 61, 62 are stacked in a layer. The semiconductor device 51 is the previously described power amplifier.

Figure 14:
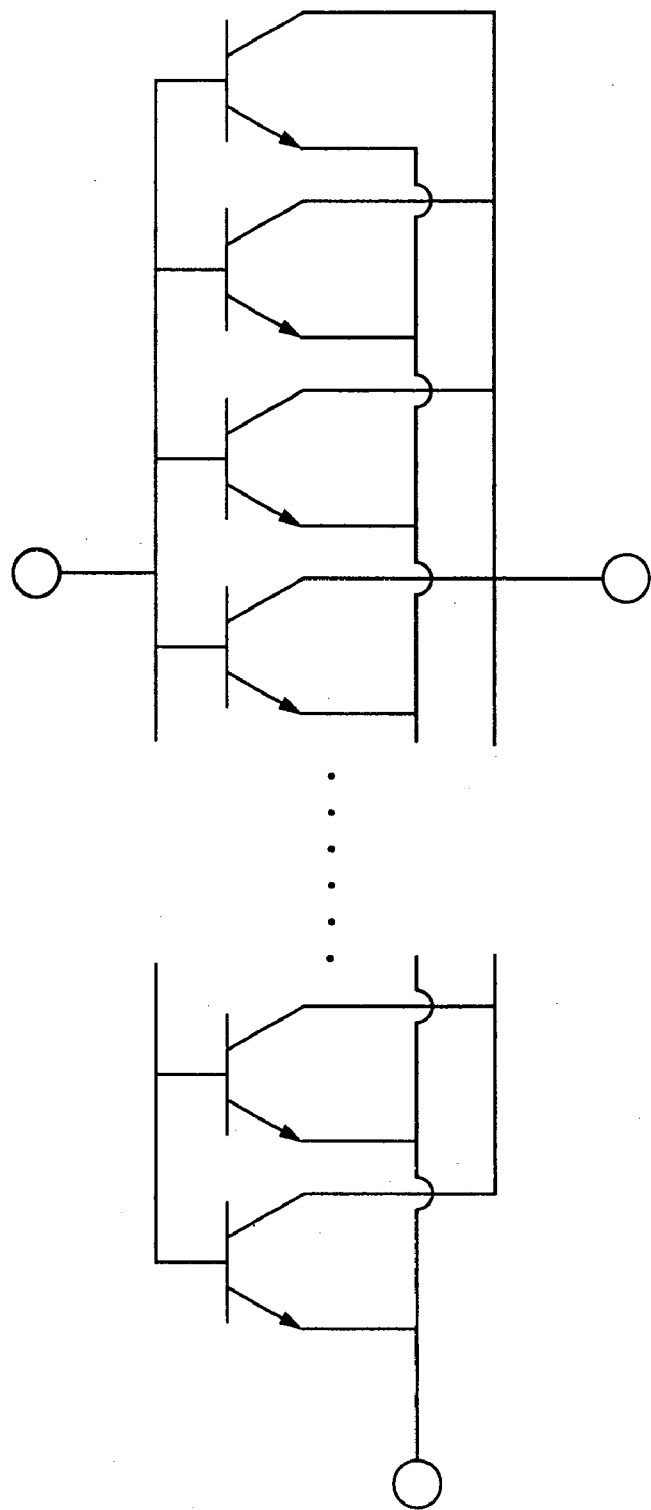
FIG. 14 is a circuit diagram of the first amplifier circuit of the power amplifier of an embodiment of the present invention.
Figure 15:
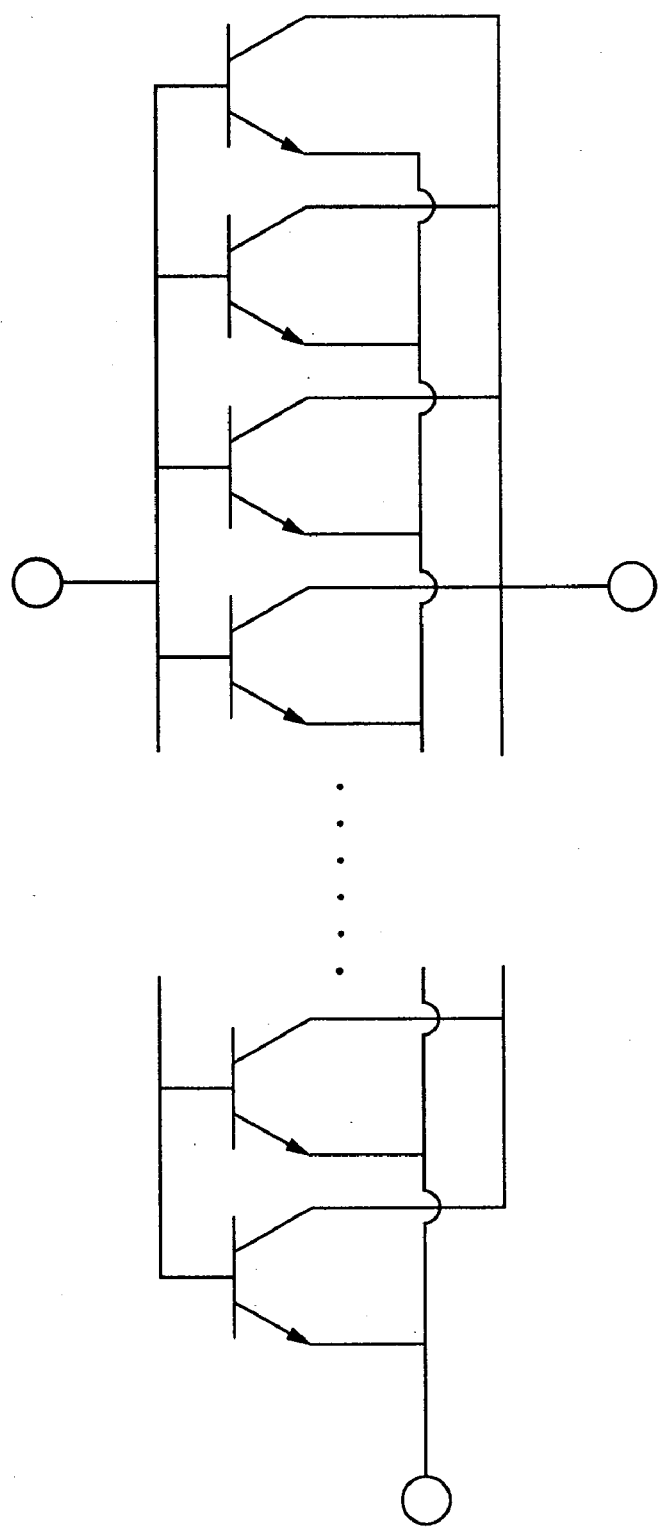
FIG. 15 is a circuit diagram of the second amplifier circuit of the power amplifier of an embodiment of the present invention.

Circuit diagrams of the first amplifier 24, and the second amplifier 25 are respectively shown in FIG. 14 and FIG. 15. The first amplifier 24 circuit is comprised a multifinger HBT made up of 10 basic HBT connected in parallel and with an emitter size of 108 µm$^2$. The second amplifier 25 circuit is comprised a multifinger HBT made up of 60 basic HBT connected in parallel and with an emitter size of 108 µm².

The basic HBT is comprised of an n-type GaAs subcollector layer (Si concentration 5×10¹⁸ cm⁻³, film thickness 0.6 µm), an n-type GaAs collector layer (Si concentration 1×10¹⁸ cm⁻³, film thickness 1.0 µm), a p-type GaAs base layer (C concentration 4×10¹⁸ cm⁻³, film thickness 150 nm), an n-type InGaP emitter layer (InP mol ratio 0.5, Si concentration 3×10¹⁷ cm⁻³, film thickness 30 nm), an n-type GaAs layer (Si concentration 3×10¹⁷ cm⁻³, film thickness 90 nm), an n-type AlGaAs ballast resistance layer (AlAs mol ratio 0.33, Si concentration 1×10¹⁷ cm⁻³, film thickness 120 nm), an n-type GaAs contact layer (Si concentration 1×10¹⁸ cm⁻³, film thickness 50 nm), and an n-type InGaAs contact layer (InAs mol ratio 0.5, Si concentration 1×10¹⁸ cm⁻³, film thickness 50 nm) are formed on at least the semi-insulating GaAs substrate. In the example of the HBT shown in FIG. 14, and FIG. 15, the bases, emitters and collectors of the individual HBT are connected in parallel with each other.

Figure 16:
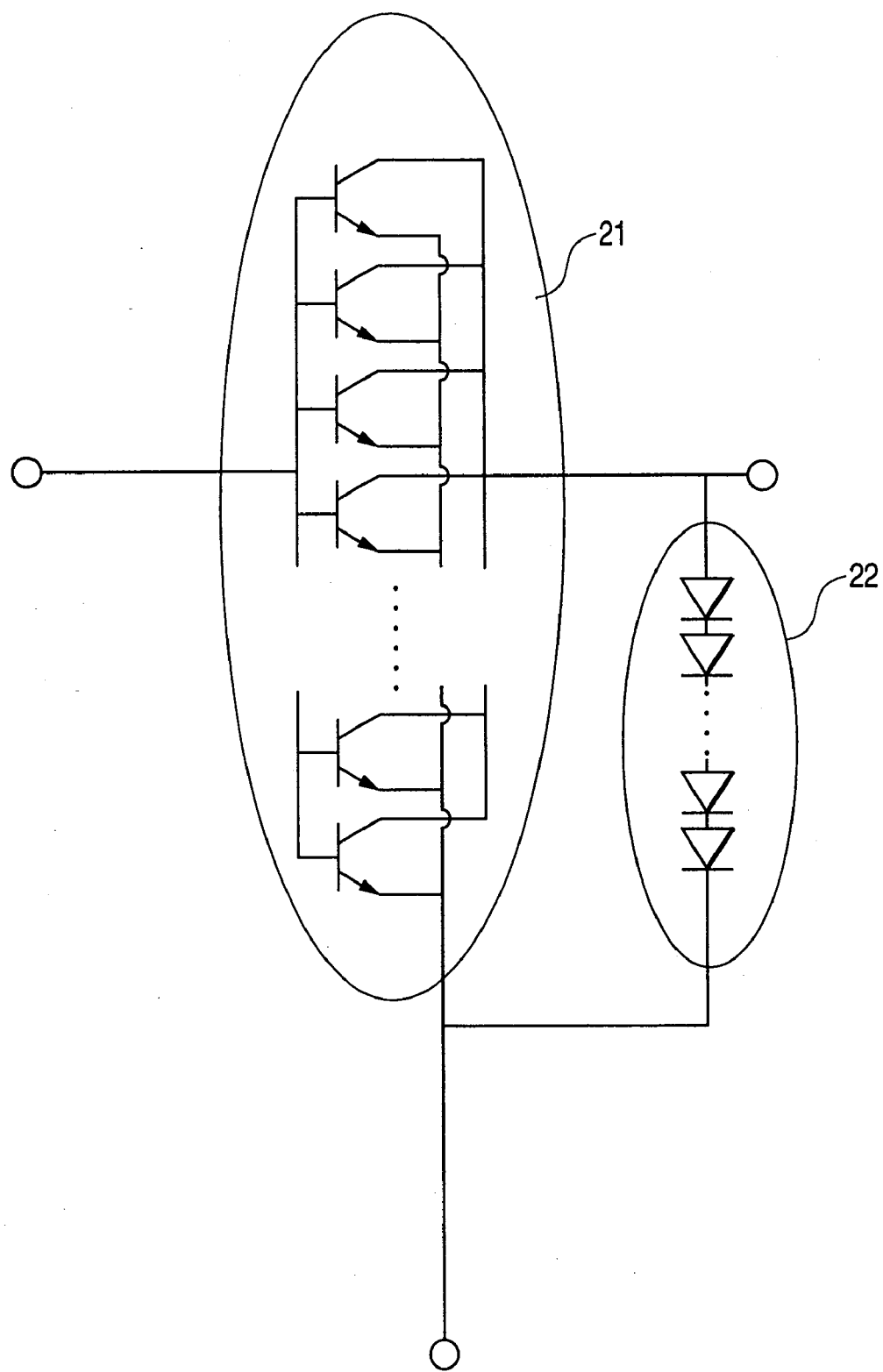
FIG. 16 is a circuit diagram of the heterojunction bipolar transistor utilized in the power amplifier of an embodiment of the present invention.

The second amplifier circuit 25 may be the amplifier circuit as shown in the circuit diagram of FIG. 16. In other words, it may be a protective circuit for protecting the HBT21 from damage when an excessive voltage such as a static charge is applied to the HBT21. The protective circuit is connected in parallel across the emitter and collector of the HBT21. The protective circuit 22 is formed on a semi-insulating GaAs substrate identical to that of the HBT21.

Figure 18:
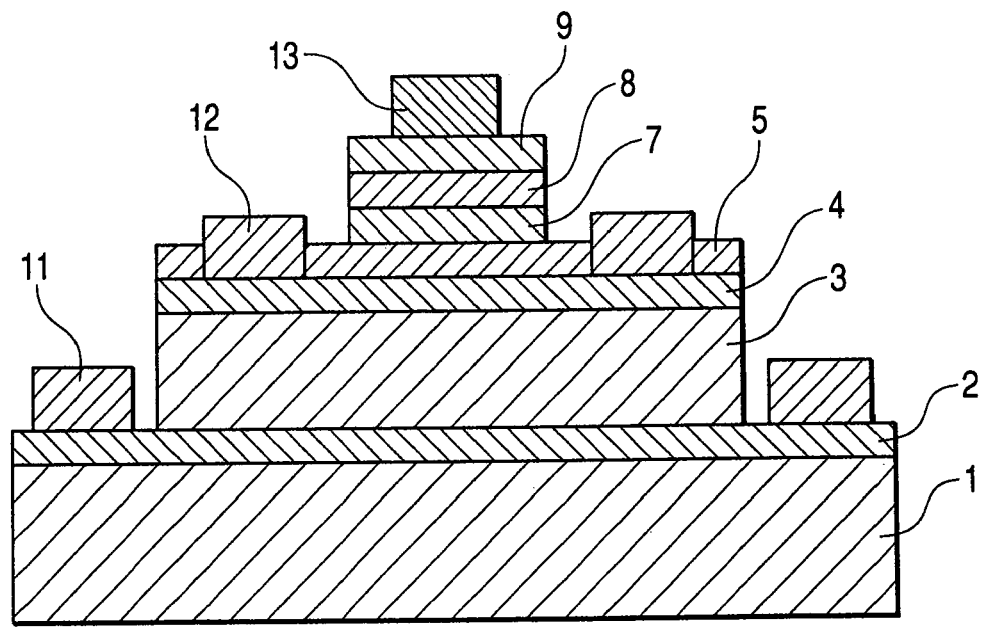
FIG. 18 is a cross sectional view for evaluating comparative characteristics of the HBT including an AlGaAs ballast resistance layer.
Figure 19:
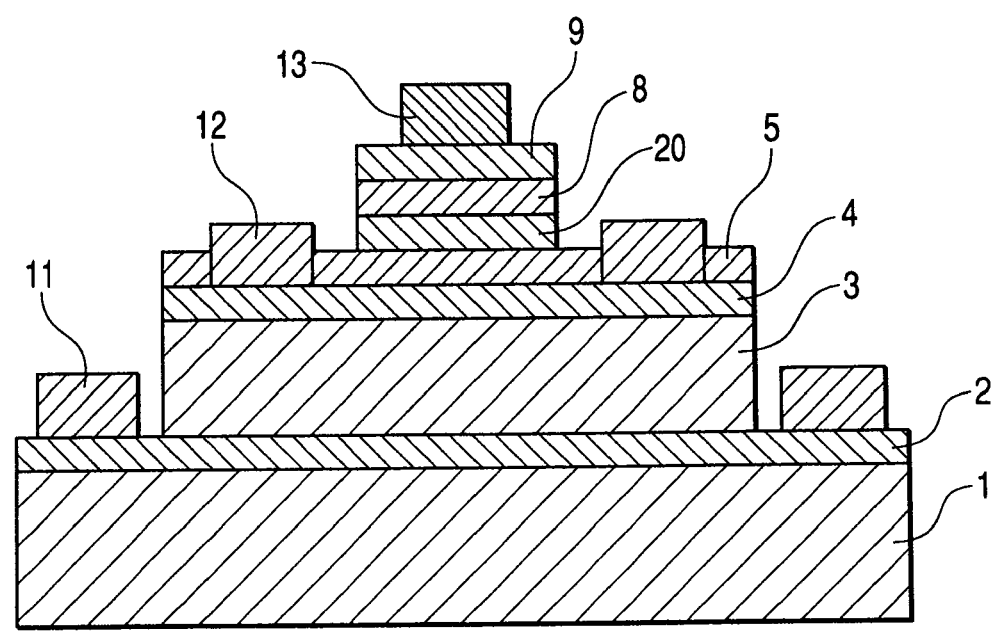
FIG. 19 is a cross sectional view for evaluating comparative characteristics of the HBT that does not include an AlGaAs ballast resistance layer.

Comparing Characteristics of the Present Invention with the Structure of the Related Art Heterojunction bipolar transistors (or HBT) including the cross sectional structures shown in FIG. 18 and FIG. 19 were fabricated and a comparison made of their reliability order to quantitatively determine in the present invention, the importance in terms of reliability of inserting a GaAs layer between the InGaP emitter layer and the AlGaAs ballast resistance layer. FIG. 18 shows the structure of the HBT in WO98/53502 Table 1 (patent document 1). A laminated structure comprised of an n-type GaAs subcollector layer 2, an n-type GaAs collector layer 3, a p-type GaAs base layer 4, an n-type InGaP emitter layer 5, an n-type AlGaAs ballast resistance layer 7, an n-type GaAs contact layer 8, and an n-type InGaAs contact layer 9 are sequentially formed in layers on the semi-insulating GaAs substrate 1. The reference numerals 11, 12, 13 in FIG. 18 respectively denote the collector electrode, base electrode, and emitter electrode. For purposes of comparison, FIG. 19 shows a structure fabricated without the AlGaAs ballast resistance layer. The laminated structure is comprised of an n-type GaAs subcollector layer 2, an n-type GaAs collector layer 3, a p-type GaAs base layer 4, an n-type InGaP emitter layer 5, an n-type GaAs layer 20, an n-type GaAs contact layer 8, and an n-type InGaAs contact layer 9 sequentially formed in layers on the semi-insulating GaAs substrate 1. The reference numerals 11, 12, 13 in FIG. 2B respectively denote the collector electrode, base electrode, and emitter electrode.

Heterojunction bipolar transistors (or HBT) with the structures shown in FIG. 18 and FIG. 9 were subjected to an electrical conduction test under identical conditions where a collector current density of 40 kA/cm², and a junction temperature of 210° C. were applied for 300 hours. Results of the test showed deterioration occurred in all twenty of the HBT with the structures shown in FIG. 18 containing an AlGaAs ballast resistance layer directly on the InGaP emitter layer. In contrast, there was no deterioration in the electrical conduction test, performed on the twenty comparison HBT shown in FIG. 19 not containing the AlGaAs ballast resistance layer.

In the results from comparing reliability, the reason for the short life of the HBT containing an AlGaAs ballast resistance layer directly on the InGaP emitter layer are as follows. A deep donor impurity level called a DX center exists within the AlGaAs layer and functions as a nonradiative (non-emissive) recombination center. Holes reverse-injected to the n-type InGaP emitter layer side from the p-type GaAs base layer reach the AlGaAs ballast resistance layer by diffusion. These holes that arrived by diffusion recombine as electrons via the DX center. Lattice defects increase with the energy emitted at this time, and reach a level causing deterioration in the device.

The invention claimed is:

1. A power amplifier including multiple stages of connected amplifier circuits comprised of at least one or more heterojunction bipolar transistors connected in parallel, wherein the heterojunction bipolar transistor is a sequentially formed structure comprised at least of an InGaP emitter layer and, a base layer forming a heterojunction together with the InGaP emitter layer on one side; and a low-doped GaAs layer and an AlGaAs ballast resistance layer on the other side, wherein the donor concentration of said low-doped GaAs layer is less than that of the AlGaAs ballast resistance layer.

2. The power amplifier according to claim 1, including a voltage limiter protection circuit connected electrically in parallel between the emitter and the collector.

* * * * *